US009513335B1

(12) United States Patent
Wilcox et al.

(10) Patent No.: US 9,513,335 B1
(45) Date of Patent: Dec. 6, 2016

(54) METHOD FOR USING XOR TREES FOR PHYSICALLY EFFICIENT SCAN COMPRESSION AND DECOMPRESSION LOGIC

(71) Applicant: Cadence Design Systems, Inc., San Jose, CA (US)

(72) Inventors: Steev Wilcox, San Jose, CA (US); Brian Edward Foutz, Charlottesville, VA (US); Paul Alexander Cunningham, Mountain View, CA (US); Vivek Chickermane, Slaterville Springs, NY (US); Krishna Vijaya Chakravadhanula, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/738,763

(22) Filed: Jun. 12, 2015

(51) Int. Cl.
*G06F 11/22* (2006.01)
*G06F 17/50* (2006.01)
*G01R 31/3177* (2006.01)

(52) U.S. Cl.
CPC .................. *G01R 31/3177* (2013.01)

(58) Field of Classification Search
CPC .................. G01R 31/318547; G01R 31/3177; G01R 31/318335; G06F 11/263; H04L 43/50
See application file for complete search history.

(56) References Cited

U.S. PATENT DOCUMENTS

| | | | | |
|---|---|---|---|---|
| 7,823,034 B2* | 10/2010 | Wohl | ............ | G01R 31/318547 714/726 |
| 7,925,947 B1* | 4/2011 | Touba | ............ | G01R 31/318547 714/726 |
| 7,996,741 B2* | 8/2011 | Touba | ............ | G01R 31/318547 714/729 |
| 8,065,651 B2* | 11/2011 | Kapur | ............ | G01R 31/318547 714/724 |
| 9,057,765 B2* | 6/2015 | Bhagat | ........... | G01R 31/318547 |
| 9,110,135 B2* | 8/2015 | Douskey | ............ | G01R 31/3177 |
| 9,134,378 B2* | 9/2015 | Gizdarski | ...... | G01R 31/318547 |
| 2006/0064614 A1* | 3/2006 | Abdel-Hafez | . | G01R 31/318547 714/726 |
| 2010/0192030 A1* | 7/2010 | Kapur | ............ | G01R 31/318547 714/726 |
| 2010/0318866 A1* | 12/2010 | Whetsel | ............. | G01R 31/3177 714/733 |
| 2013/0290795 A1* | 10/2013 | Rajski | ............ | G01R 31/318335 714/712 |
| 2015/0234009 A1* | 8/2015 | Whetsel | ............. | G01R 31/3177 714/727 |

\* cited by examiner

*Primary Examiner* — Nha Nguyen
(74) *Attorney, Agent, or Firm* — Andrews Kurth Kenyon LLP

(57) ABSTRACT

Methods and apparatus for decompressing test data using XOR trees for application to scan chains of a design for test (DFT) integrated circuit in a physically efficient construction are disclosed. Moreover, methods and apparatus for compressing test response data from scan chains in a DFT integrated circuit in a physically efficient construction are disclosed. The XOR tree decompression method may comprise splitting signals at each node of the XOR trees according to distribution logic implemented by a set of XOR gates. The XOR tree compression method may comprise combining signals at each node of the XOR trees according to combination logic implemented by a set of XOR gates.

10 Claims, 16 Drawing Sheets

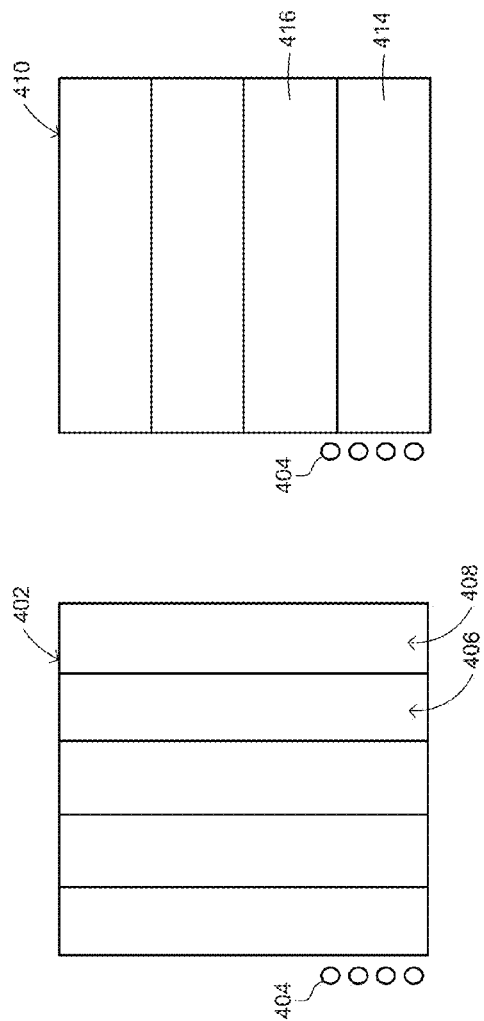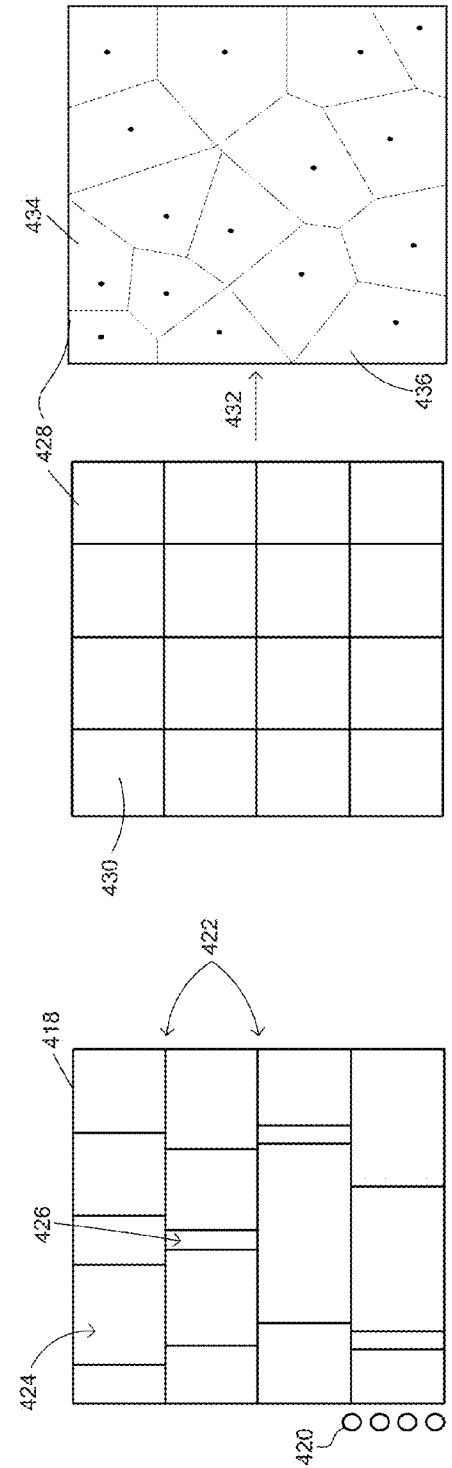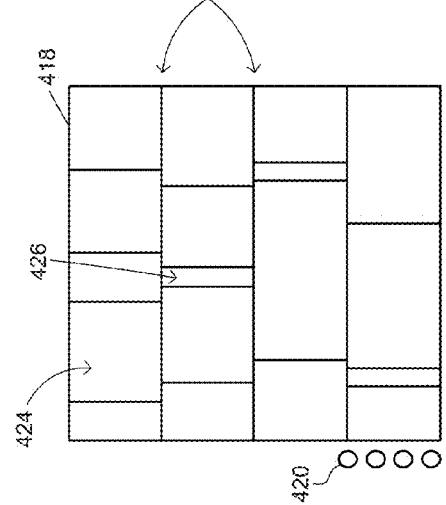
FIG. 4A
FIG. 4B
FIG. 4C
FIG. 4D

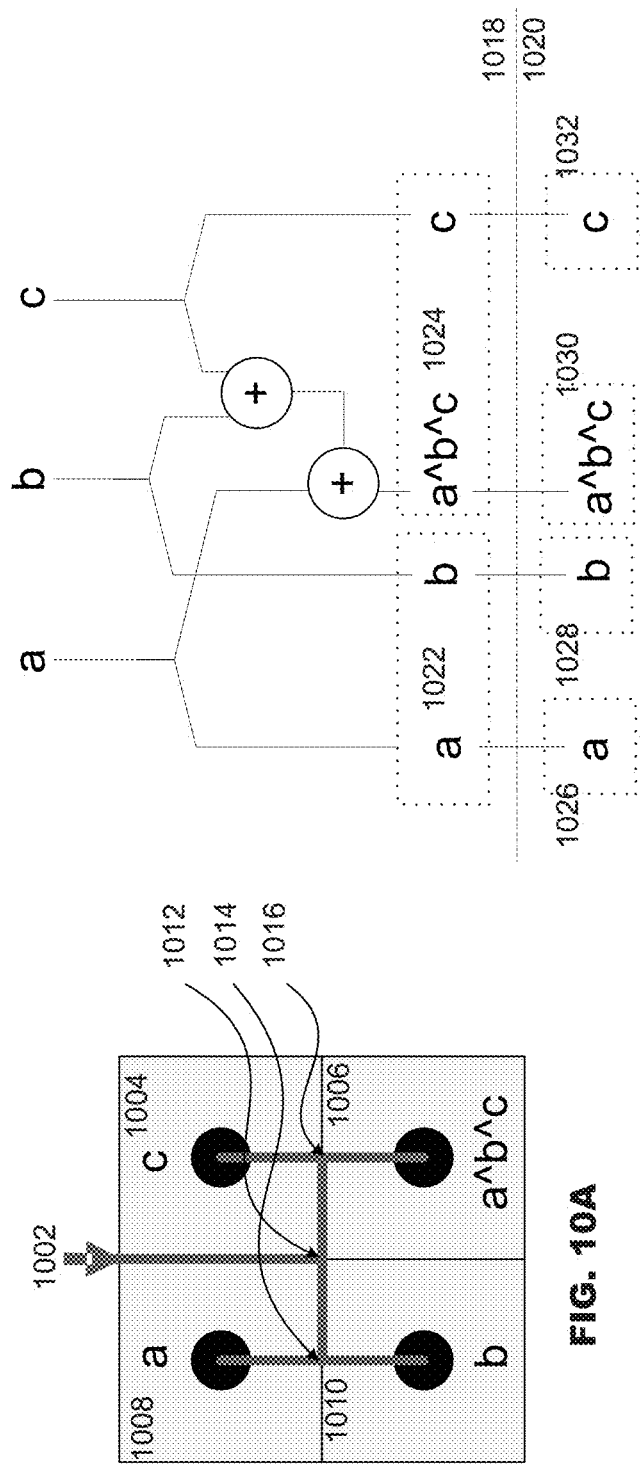

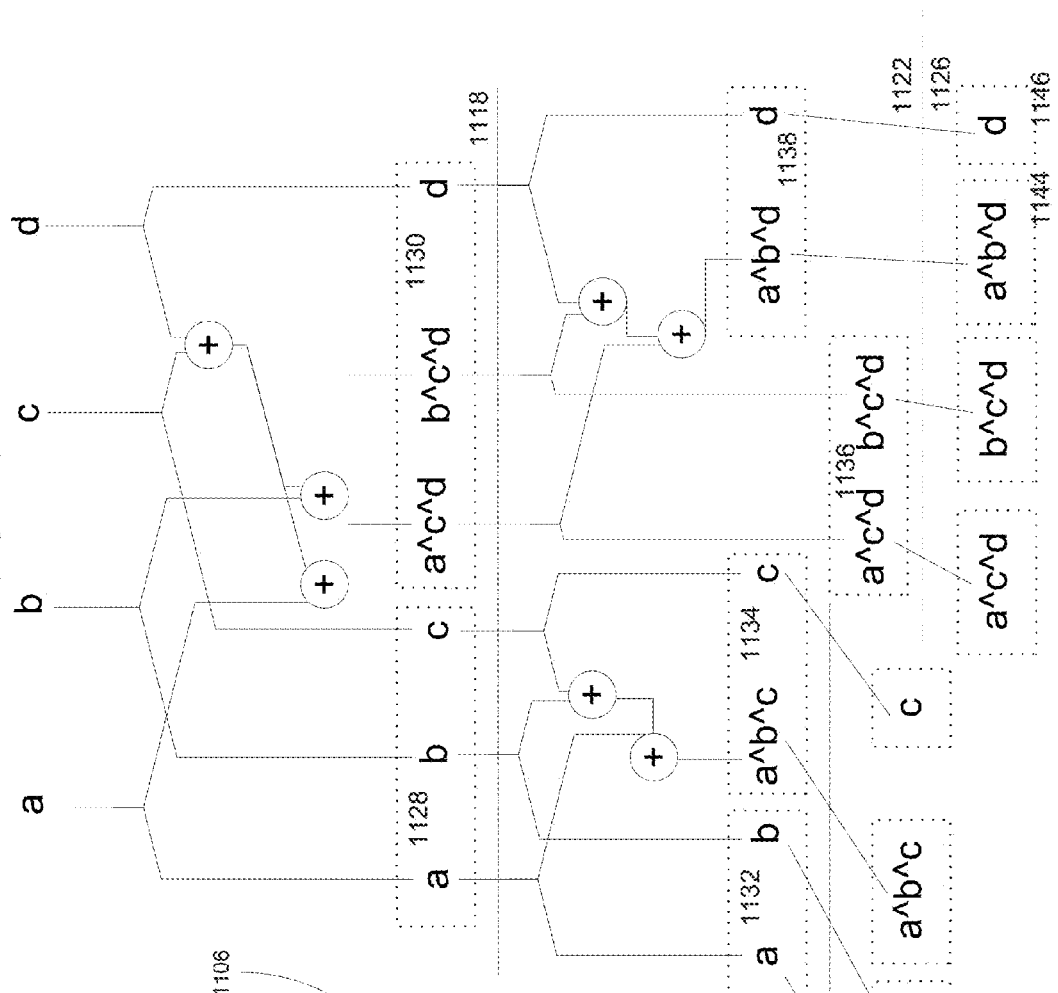
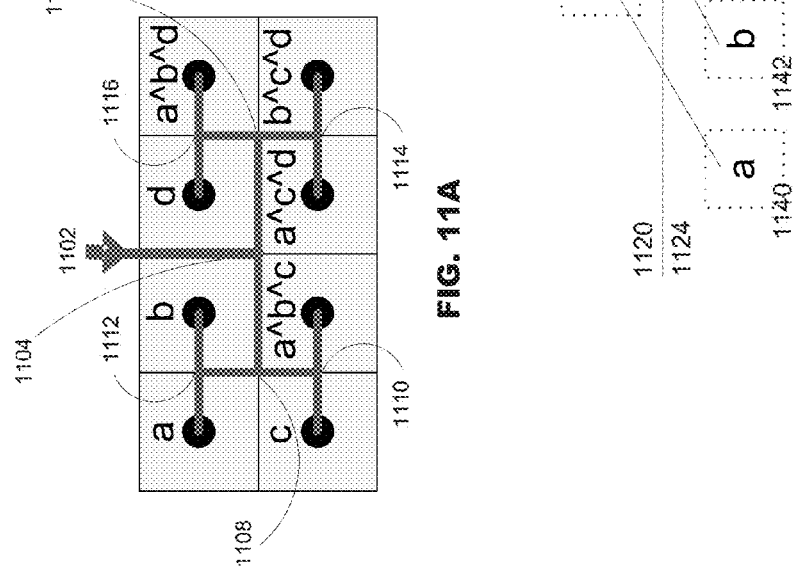

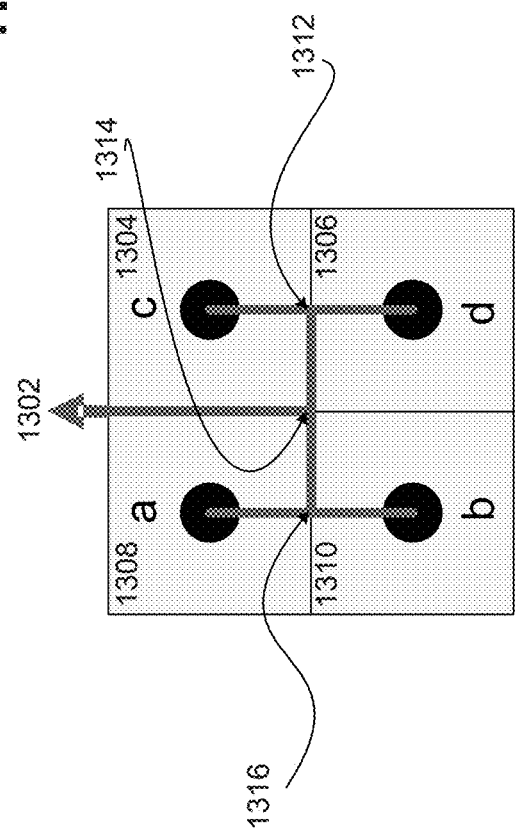
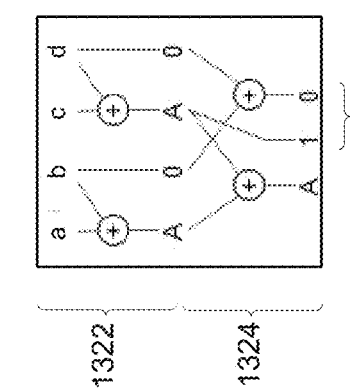
FIG. 13A
FIG. 13B
FIG. 13C

METHOD FOR USING XOR TREES FOR PHYSICALLY EFFICIENT SCAN COMPRESSION AND DECOMPRESSION LOGIC

TECHNICAL FIELD

The present invention relates to methods, systems, and computer-readable media for testing integrated circuit designs; the invention also relates to an integrated circuit implementing a physically efficient scan using compression and decompression logic distributed over XOR trees.

CROSS-REFERENCE TO RELATED APPLICATIONS

This application is being filed concurrently with U.S. patent application Ser. No. 14/738,765, entitled "Method for Using Sequential Decompression Logic for VLSI Test in a Physically Efficient Construction," and with U.S. patent application Ser. No. 14/738,746, entitled "Method for Dividing Testable Logic into a 2-Dimensional Grid for Physically Efficient Scan," both of which are incorporated herein by reference in their entireties.

BACKGROUND

Modern integrated circuits ("ICs") in production contain ever-increasing numbers of components. Testing of those ICs requires a large number of test patterns. For each IC to be tested, design for test ("DFT") designers have the challenge of inputting a huge volume of scan test sequences, produced by techniques such as automatic test pattern generation ("ATPG"), via a minimal number of test pins, with consequent substantial test time and tester memory requirements.

In order to address these challenges, DFT designers have used a technique called Test Compression. Test Compression reduces test data volume and test application time ("TAT") while retaining test coverage. Using Test Compression, highly compressed test stimuli can be applied to low-pin count automated test equipment ("ATE"), which decompresses the test stimuli stored on the ATE to the actual test stimuli to be applied to a large number of scan channels that feed the logic under test. After applying the scan chain data to the logic under test one or more functional clocks are applied and the test stimuli is captured by the scan channels and the test stimuli is then compressed for measurement and comparison. Test Compression recognizes that only a small percentage of scan cells in an ATPG-generated scan chain ("care bits") are necessary for testing. Test Compression modifies the design to apply the care bits in shorter scan chains, reducing the TAT. The compression ratio generated by Test Compression methods is capable of greatly reducing the test data volume and TAT. For example original data having a volume of 6 Gb and TAT of 20 seconds is, at a 100× compression ratio, reduced by 99% to 60 Mb and TAT of 0.2 seconds.

Test Compression is driven by two structures: a Decompressor and a Compressor (or Compactor). The Decompressor drives the compressed test stimuli onto the IC from the small number of scan-in pins on the ATE to the large number of internal scan channels which feed the logic under test. The Decompressor is designed to allow a continuous flow of stimuli so that it is possible to load the scan chain data for a given test onto the IC and to unload from the IC the previous test response data to the Compressor, all in a single clock cycle. Compression and Decompression logic generally are built using discrete logic gates such as XORs, multiplexers and flip-flops and placed inside a logic module called CoDec which is normally placed in one corner of the IC. Wires transfer test stimuli from the DeCompressor inside the CoDec to the head of the scan channels which may be distributed across the area of the IC. Similarly wires from the tails of the scan channels transfer the test stimuli to the Compressor inside the CoDec.

Wiring all of these connections directly between the scan chains scattered over the surface area of the IC and the decompression and compression logic is referred to as traditional global scan wiring. To reduce the cost of testing ICs DFT engineers try to build more scan chains of a shorter length to increase the compression ratio. Higher compression ratios mean that there are more wires running from the CoDec to the heads and tails of the shorter and more numerous scan chains, The additional wiring increases the footprint of the IC and may lead to wiring congestion in some areas of the IC. Several methods have been introduced in efforts to correct the on-board congestion issues associated with compression logic, such as improved XOR mapping and partitioned Compressor-Decompressors. However, these methods are at best incremental improvements and do not address the issue of area overhead and extreme wiring congestion.

As chip complexity increases, compression ratios have to increase. However, the physical chip layout can prevent implementation of the large compression ratios needed to reduce the cost of test. At a certain point, the total number of wires that can be manufactured and connected to the CoDec presents a bottleneck.

BRIEF DESCRIPTION OF THE DRAWINGS

FIG. 4A illustrates a 1-dimensional column distribution scheme for a CoDec.

FIG. 4B illustrates a 1-dimensional row distribution scheme for a CoDec.

FIG. 4C illustrates a 2-dimensional distribution scheme for a CoDec.

FIG. 4D illustrates a 2-dimensional logic intensive distribution scheme for a CoDec.

FIG. 10A illustrates an embodiment of testable logic being split over a small grid applied to an IC according to decompression logic implemented by the XOR tree distribution scheme.

FIG. 10B illustrates an embodiment of testable logic being implemented using XOR decompression logic at the nodes of a small grid applied to an IC.

FIG. 11A illustrates an embodiment of testable logic being split over a larger grid applied to the IC according to decompression logic implemented by the XOR tree distribution scheme.

FIG. 11B illustrates an embodiment of testable logic being implemented using XOR decompression logic at the nodes of a larger grid applied to an IC.

FIG. 13A illustrates an embodiment of a method for compressing test results from a small grid on an IC using the XOR tree distribution.

FIG. 13B illustrates an embodiment of a method for determining, from the compressed test results provided by a small grid on an IC, a location of a fault on the grid using the XOR tree distribution.

FIG. 13C illustrates an embodiment of a table used in a method to decode the compressed test results provided by a small grid on an IC according to the XOR tree distribution.

DESCRIPTION OF EMBODIMENTS

Figure 1:
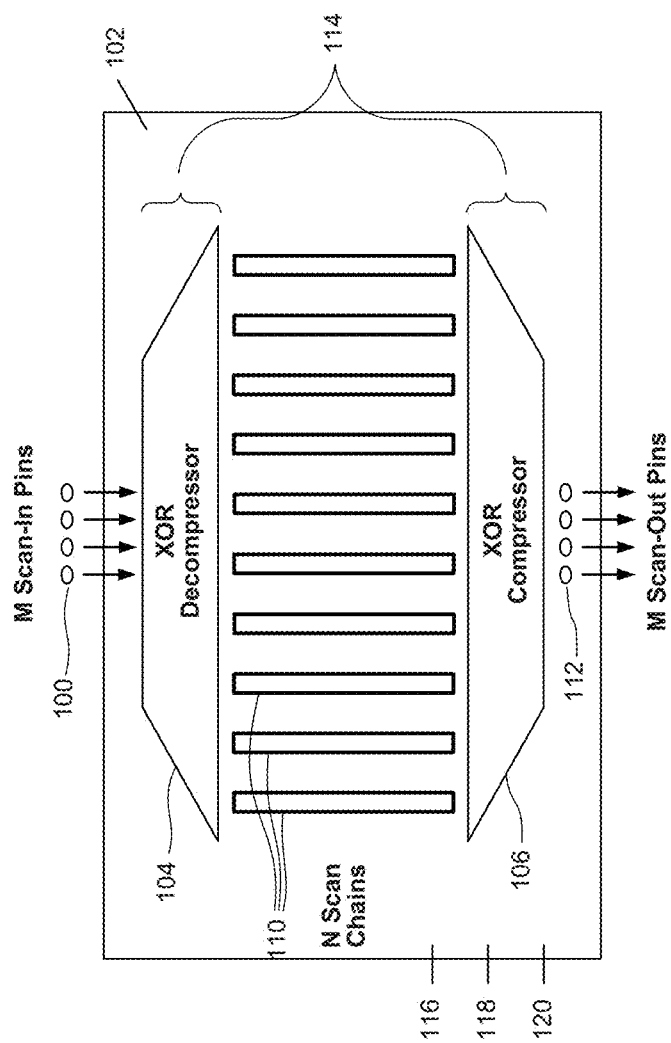
FIG. 1 illustrates application of test stimuli from an ATE to an IC using a Decompressor, which converts M scan-in pins into N scan chains, and removal of response data after the application using a Compressor, which converts N scan chains into M scan-out pins.

The following description of embodiments provides non-limiting representative examples referencing numerals to particularly describe features and teachings of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention to such an extent that other implementations, not specifically disclosed but within the knowledge of a person of skill in the art having read the description of embodiments, would be understood to be within the scope of the invention.

One aspect of the present disclosure is to provide device configurations and methods for testing integrated circuit design using Test Compression methods that by distributing the DeCompressor over an integrated circuit using XOR trees, and compiling results from the testable logic into the Compressor over the integrated circuit using XOR trees, resulting in a physically efficient Test Compression structure. The methods and apparatuses herein address at least one of the test decompression and test compression problems described above. Accordingly, one aspect of the present invention relates to a method for distributing Decompression test logic over a surface area of an IC by implementing XOR trees over the surface area of the IC. Another aspect of the present invention relates to a method for compiling results from testing over the surface area of the IC into a Compressor by implementing XOR trees over the surface area of the IC is provided.

In one embodiment, the distribution of DeCompressor logic using XOR trees over an integrated circuit for a physically efficient scan comprises: determining a number of scan inputs in the set of scan inputs; propagating each of the number of scan inputs as signals; determining a 2-dimensional grid layout over the integrated circuit; overlaying the determined grid with an XOR tree such that a different one of the leaves of the exclusive OR (XOR) tree is situated in each grid cell of the determined grid; at each node of the XOR tree: assessing a number of signals, k, present at the node; if k=2: sending a first of the signals along a first path from the node and sending a second of the signals along a second path from the node; if k>2: splitting the number of signals into two sets of k−1 signals: the first set of signals including a first k−2 group from the number of signals, the second set of signals including: an XOR of the first k−2 group from the number of signals with an output from an XOR of a last signal from the number of signals with a second to last signal from the number of signals, and the last signal from the number of signals, sending the first set of signals along the first path from the node, and sending the second set of signals along the second path from the node.

In some embodiments, the 2-dimensional grid layout is determined according to the method described in the related filing titled, "Method for Dividing Testable Logic into a 2-Dimensional Grid for Physically Efficient Scan." In some embodiments, each grid cell includes only one scan chain. In other embodiments, each grid cell implements multiple scan chains. When one scan chain is provided in a grid cell, the scan chain receives the decompressed test data from a leaf of the XOR tree that is associated with the grid cell. A leaf of an XOR tree is associated with a grid cell if the leaf is placed or affixed in the grid cell. If more than one scan chain is provided in a grid cell, the scan chains receive a local broadcast of the decompressed test data from the leaf of the XOR tree that is associated with the grid cell. Every scan chain in the grid will receive identical decompressed test data.

If the number of scan inputs in the set of scan input is less than a number of required scan inputs to generate enough odd terms to propagate to each of the grid cells of the 2-dimensional grid, then the number of scan input signals are all propagated down both paths, or branches, leading away from the node. The internal propagation of data down both paths, or branches, of an XOR tree can be performed as many times as necessary to populate the entire set of leaves of the XOR tree with odd term test data. Similarly, if the number of signals at a node of the XOR tree is less than two, splitting a signal at the node such that it is provided both along the first path and along the second path provides the necessary terms to the leaves of the XOR tree. In accordance with the method, each leaf provides a respective odd term that was generated form the decompression logic over the XOR trees to the local grid cell.

In the above-described embodiments, the XOR tree is implemented on a $2^p$ by $2^q$ 2-dimensional grid where p and q are both integers greater than zero. In some embodiments, a single XOR tree is mimicked on a larger scale to a larger area in which $2^p$ is increased by an integer factor, r, to size $r*2^p$ and $2^q$ is increased by an integer factor, s, to size $s*2^q$.

In yet another aspect, a method for constructing a Compressor for compressing the test responses gathered from multiple scan chain using XOR trees over an integrated circuit in a design for test integrated circuit is provided. In one embodiment for compressing test response data, the method comprises: determining a number of scan outputs; determining a 2-dimensional grid layout over the integrated circuit; overlaying the determined grid with an XOR tree such that a different one of the leaves of the exclusive OR (XOR) tree is situated in each grid cell of the determined grid; propagating the test response data collected at the leaves of the XOR tree as signals; at each node of the XOR tree: performing a bitwise XOR of a first signal at the node and a second signal at the node, preserving a most significant bit (MSB) of the second signal at the node, inserting the MSB of the second signal into a bit position having the second highest-order following the MSB to form a node output signal, and propagating the node output signal away from the leaves.

In some embodiments, the method further comprises collecting the test response data from a scan chain in each grid cell of the determined grid. The leaves of the XOR tree collect the test response data, each collecting the test response data from a scan chain associated with a respective grid cell.

The method is implemented such that a first number of bits of the first signal and a second number of bits of the second signal subjected to the bitwise XOR are each a count of a number of nodes through which the first signal and the second signal has passed. Accordingly, if test response data is traveling from a leaf and passes through 3 nodes, the number of bits in each of the first signal and the second signal subject to the bitwise XOR is 3. Similarly, the bitwise XOR is performed by a set of XOR gates, a number of XOR gates in the set being equal to the number of nodes through which the first signal and the second signal have passed. In order to implement the bitwise XOR, one XOR gate is provided for each of the bits to be XOR'd. Other methods for producing bitwise XORs known to one of skill in the art is considered incorporated herein.

In some embodiments, the method further describes analyzing the test response data from the number of scan outputs to determine the location of a fault. The compressed test response data on the number of scan outputs provides an encoded location of the 2-dimensional grid. In an embodiment, if the encoded outputs refer to a region of the 2-dimensional grid, then that particular region has a defect that results in the capture of a faulty test response in the scan chain present in that grid.

In the event that the method is implemented in circumstances with very limited scan outputs, the most significant bits of the scan outputs can be ignored. By ignoring the higher numbered outputs, there is a reduced diagnosability, but it does not significantly affect the method.

In one embodiment, an exclusive OR (XOR) tree decompressor that decompresses a set of set inputs to a design for test circuit is implemented. The XOR tree decompressor comprises:

a signal propagating the set of inputs as a set of signals over a 2-dimensional grid spread over an integrated circuit, the 2-dimensional grid having a number of grid cells; nodes at which the signal splits into a first branch and a second branch, each node of the XOR tree decompressor resulting in a first signal set being sent along the first branch and a second signal set being sent along the second branch; and leaves contacting scan chains in each of the grid cells, wherein the first signal and the second signal are for each node determined by: assessing a number of signals, k, present at a respective node, responsive to the number of signals being two: a first one being the first signal set and a second one being the second signal set, responsive to the number of signals being greater than two: splitting the number of signals into two sets of k−1 signals: the first signal set including a first k−2 group from the number of signals, the second signal set including: an XOR of the first k−2 group from the number of signals with an output from an XOR of a last signal from the number of signals with a second to last signal from the number of signals, and the last signal from the number of signals.

In another embodiment, an exclusive OR (XOR) tree compressor that compresses a set of test response data from a design for test circuit is implemented. The XOR tree compressor comprises: leaves, with each leaf being positioned in a grid cell of a 2-dimensional grid layout of an integrated circuit, the leaves each collecting the set of test response data from a respective scan chain and propagating the set of test response data as a set of signals; nodes, with each node containing a set of XOR gates, and with each node combining a first of the set of signals and a second of the set of signals into a combined response signal and sending the combined response signal in a direction away from the leaves; and a signal providing a final combined response signal as a set of scan outs, wherein each node combines the first of the set of signals and the second of the set of signals into the combined response signal by: providing, on a bitwise basis, the first of the set of signals and the second of the set of signals as inputs to the set of XOR gates, preserving a most significant bit (MSB) of the second of the set of signals at the node, and inserting the MSB of the second of the set of signals into a bit position having the second highest-order following the MSB to form the combined response.

In some embodiments, the $2^p$ by $2^q$ 2-dimensional grid is not symmetric and therefore, p does not equal q. In other embodiments, the grid is symmetric and p equals q.

To implement a test as part of a DFT, a test pattern including test stimuli, must be applied to the IC. When compression and decompression logic is implemented, the Decompressor is located between test input pins and scan chain heads and the Compressor is located between the scan chain tails and the test output pins. A scan clock is pulsed to shift the test patterns into the scan chains, and then the results are shifted out to the chip output pins. The test results from the DUT are then available for comparison against the expected results. The Decompressor is implemented on board the IC in order to expand the test data from a small number of input pins on the ATE to a larger number of scan chains on the IC. The Compressor is implemented on board the IC in order to compress the results data from a large number of scan chains on the IC to a smaller number of output pins on the ATE.

FIG. 1 illustrates application of test stimuli from an ATE to an IC using a Decompressor, which loads test data from M scan-in pins to N scan chains, and unloading of response data after the application using a Compressor, which transfers the compresses the test response from N scan chains into M scan-out pins. M scan-in pins 100 from the ATE are aligned with test patterns bearing test stimuli. When the mode pin 116 of the IC 102 is switched to "test mode", the test patterns are shifted onto the IC for a number of cycles associated with scan clock 118. The test patterns propagate through the XOR Decompressor 104 and populate register sets associated with the N scan chains 110. The test data is then stimulated, or tested, for a number of capture cycles associated with the functional clock 120. Then the test results are shifted out of the IC for a number of cycles associated with scan clock 118. The test results propagate through the XOR Compressor 106 and out of the IC onto M scan-out pins 112. The test results are then held in the memory of ATE for comparison to the expected data. The Decompressor 104 connected between the scan in pins 108 and the scan chains 110 can be represented by an M to N directed acyclic graph (DAG). The Compressor 106 located between the scan chains 110 and the scan out points 112 can be represented by an N to M DAG. Collectively, the Compressor 104 and the Decompressor 106 comprise a CoDec 114.

Figure 2:
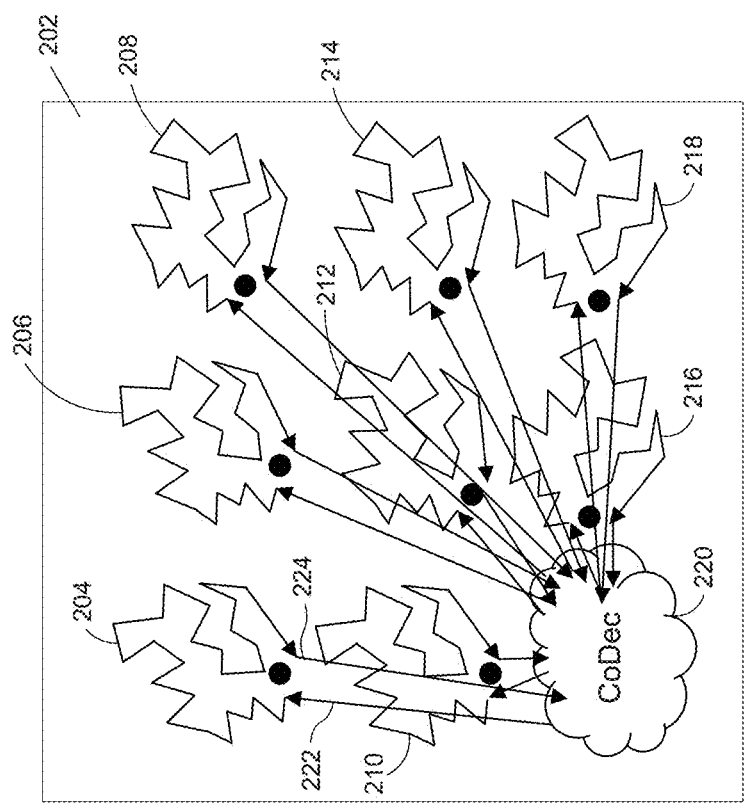
FIG. 2 illustrates an IC hosting DFT compression and decompression logic according to a global placement topology.

FIG. 2 illustrates an IC hosting DFT compression and decompression logic according to a global placement topology. IC 202 includes 8 different scan chains (204, 206, 208, 210, 212, 214, 216, 218) and CoDec 220. CoDec 220 includes the compression and decompression logic for the entire IC 202. Accordingly, before test data is loaded into each of the scan chains, it must pass through the CoDec 220. After the test data has been decompressed in the CoDec 220, it is routed to a corresponding portion of the IC and a respective scan chain. To perform this routing, wires (e.g., 222) connect from the Decompressor portion of CoDec 220 to the scan chains. After the test data has been stimulated, the test results return to the Compression portion of the CoDec 220 for compression via wires (e.g., 224).

The area immediately surrounding the CoDec 220 becomes congested as the number of wires connecting to and from the scan chains increases. The shorter the scan chains, the more total wire length needed to connect to and from the CoDec 220. As the compression ratio implemented by the CoDec increases, the length of each scan chain (e.g., 204) decreases. However, as each scan chain is shortened the total number of scan chains increases, and the wire length to and from the scan chains to the CoDec increases. In these circumstances, the result is that at least some of the test data travels over long wires in order to be compressed and decompressed. Therefore, as compression ratios improve, complex wiring from the scan chains to and from the CoDec result.

Figure 3A:
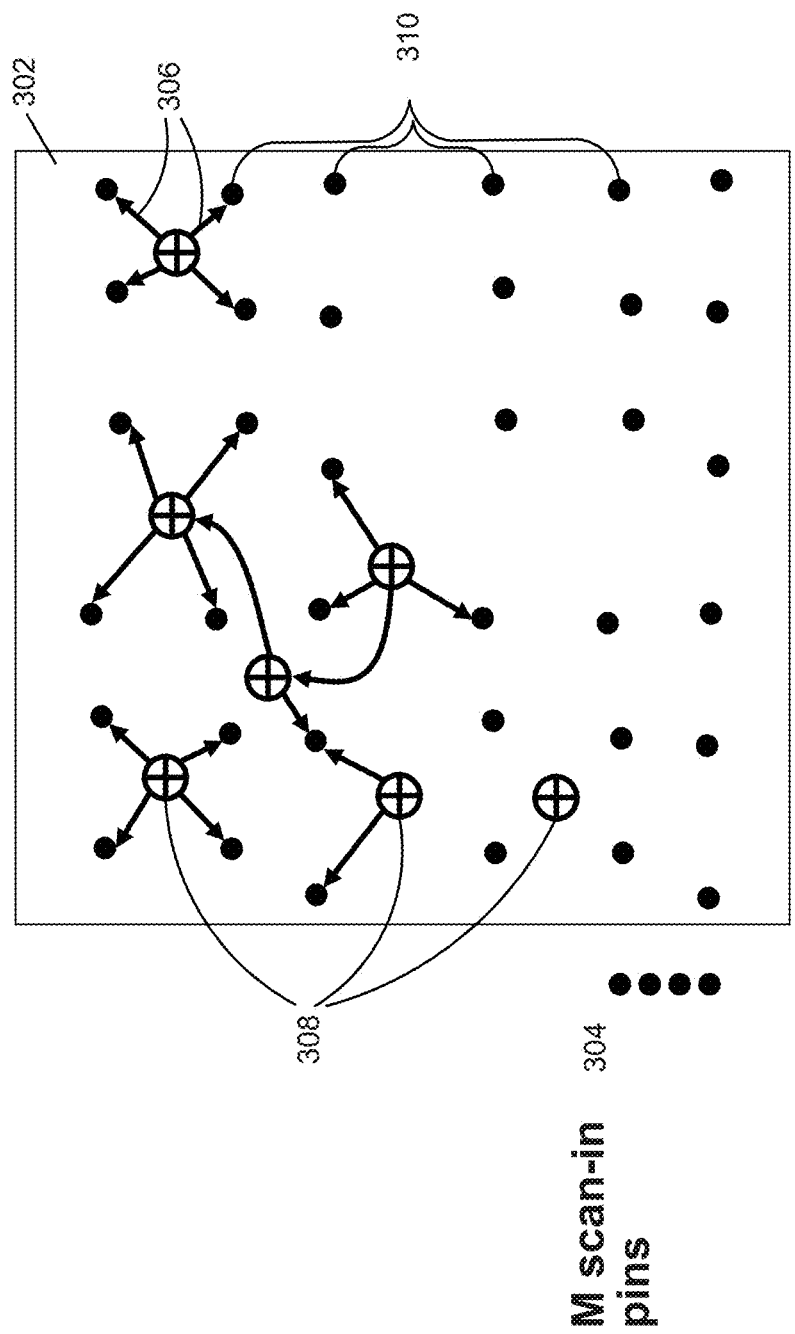
FIG. 3A illustrates distribution of the decompression logic over the 2-dimensional IC by placement of XOR gates involved in the decompression logic over the chip area.

FIG. 3A illustrates distribution of the decompression logic over the 2-dimensional IC by placement of XOR gates involved in the decompression logic over the chip area. One aspect of the present invention enables provision of less complex wiring while implementing a high decompression ratio. In an embodiment provides for most efficient placement of a physically distributed Decompressor, so as to reduce wire length and minimize congestion. FIG. 3 illustrates an IC 302 that has M scan-in pins 304, which provide the IC 302 with the test stimuli via test patterns. The IC 302 includes N scan channel nodes 310 that are available for application of the test stimuli 306. In order to feed all of the N scan channel nodes 310, discrete XOR gates 308 are distributed throughout the surface of the IC 302 for ease of forming wire connections between the N scan channel nodes 310 and the discrete XOR gates 308. On the surface of the IC 302, only some of the N scan channel nodes 310 are labeled, but it should be understood that the labeling is limited for clarity, and that 310 refers to all of the presented N scan channel nodes on the surface of IC 302.

Figure 3B:
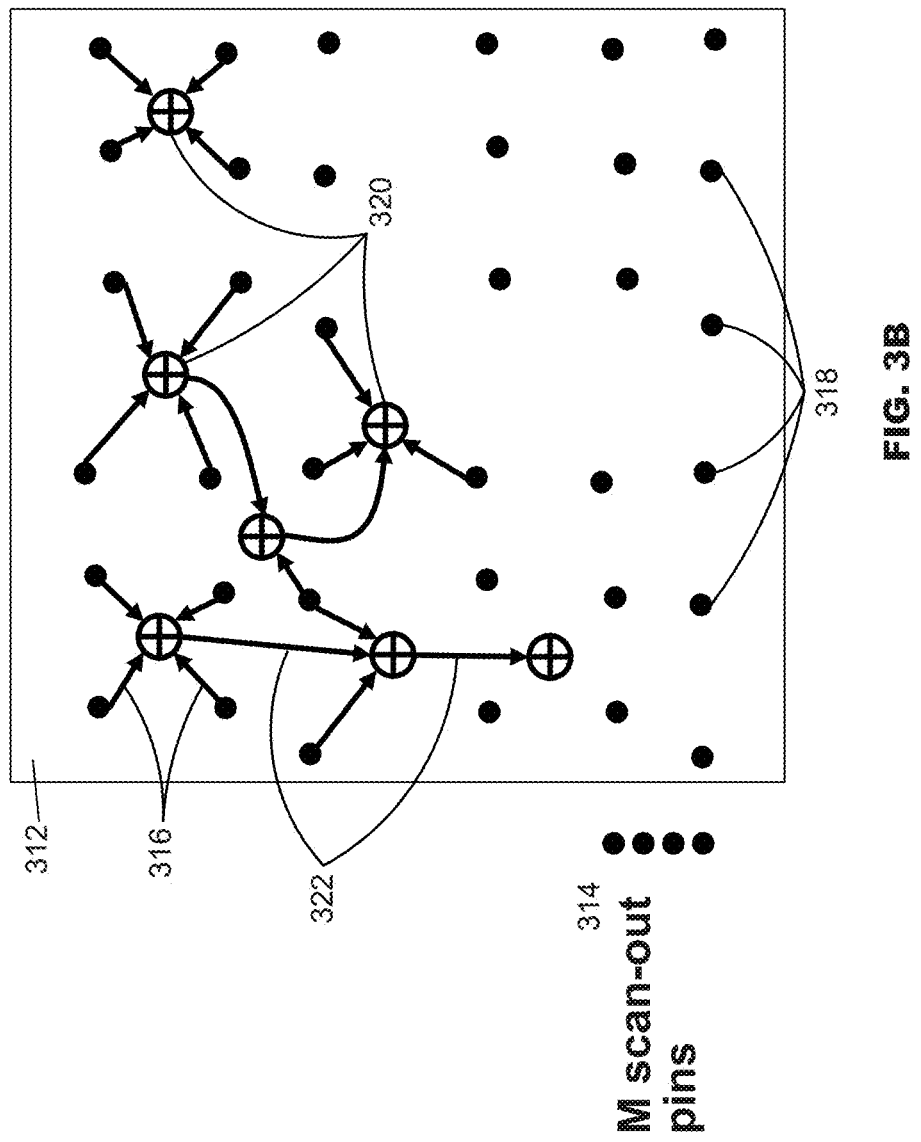
FIG. 3B illustrates distribution of the compression logic over the 2-dimensional IC by placement of XOR gates involved in the compression logic over the chip area.

FIG. 3B illustrates distribution of the compression logic over the 2-dimensional IC by placement of XOR gates involved in the compression logic over the chip area. The present invention provides a solution for providing less complex wiring while implementing a high compression ratio. An embodiment of the solution presented is implemented such that a physically distributed Compressor, which reduces wire length and minimizes congestion, can be most efficiently placed. FIG. 3B illustrates an IC 312 that has M scan-in pins 314, which provide the IC 312 with the test stimuli via test patterns. The IC 312 includes N scan channel nodes 318 that are available for removal of the test response data. In order to recover test response data associated with all of the N scan channel nodes 318, discrete XOR gates 320 are distributed throughout the surface of the IC 312 for ease of forming wire connections between the N scan channel nodes 318 and the discrete XOR gates 320. Removal of the test response data is then performed by cascading the test response data over a series of XORs as shown in 322. On the surface of the IC 312, only some of the N scan channel nodes 318 are labeled, but it should be understood that the labeling is limited for clarity, and that 318 refers to all of the presented N scan channel nodes on the surface of IC 312.

When placing XOR gates for compression and decompression, it should be understood that different schemes can be used to partition an IC for distribution of test stimuli and test patterns and in order to cull test response data. Partitioning the IC can be performed according to 1-dimensional or 2-dimensional structures. The method, device, and system described herein are specifically provided with regard to a 2-dimensional distribution structure. FIGS. 4A to 4D illustrate embodiments of some of these different schemes. It is to be understood that FIGS. 4A to 4D are non-limiting examples of XOR distribution schemas, which could further be applied to other combinational gate distribution schemas.

FIG. 4A illustrates a 1-dimensional column distribution scheme for a CoDec. In FIG. 4A, the IC 402 is divided into vertical strips, or columns. Scan in and scan out data is provided via M scan pins 404. Inside each of the columns, logic for compression and decompression is placed, in some embodiments in the form of a CoDec. Each vertical strip, including strips such as 406 and 408, is placed such that all of the strips each contain the same number of flops. Grid strips 406 and 408 each indicate an area inside of which compression logic and decompression logic is placed for distribution to localized flops. The grid cells shown do not indicate actual physical division of the IC into separate pieces but instead indicate a hypothetical dividing line over which wiring for scan chain connections to CoDecs cannot cross. The vertical strip distribution schema is particularly well-suited to be implemented with fullscan technology, where the scan input and output is distributed around the boundary of the chip. Compression logic and decompression logic is generated locally within each of the strips. Division of an IC into vertical strips, however, does not improve matters when there is a high compression ratio: the result is too many strips.

FIG. 4B illustrates a 1-dimensional row distribution scheme for a CoDec. In FIG. 4B, the IC 410 is divided into horizontal strips, or rows. Scan in and scan out data is provided via M scan pins 412. Inside each of the rows, logic for compression and decompression is placed, in some embodiments in the form of a CoDec. Each horizontal strip, including strips such as 416 and 414, is placed such that all of the strips each contain the same number of flops. Grid strips 416 and 414 each indicate an area inside of which compression logic and decompression logic is placed for distribution to localized flops. The grid cells shown do not indicate actual physical division of the IC into separate pieces but instead indicate a hypothetical dividing line over which wiring for scan chain connections to CoDecs cannot cross. The horizontal strip distribution schema is, like the vertical strip distribution, particularly well-suited to be implemented with fullscan technology, where the scan input and output is distributed around the boundary of the chip. Compression logic and decompression logic is generated locally within in each of the strips. Division of an IC into horizontal strips, however, does not improve matters when there is a high compression ratio: the result is too many strips.

FIG. 4C illustrates a 2-dimensional distribution scheme for a CoDec. In FIG. 4C, one of the strip schemes of FIGS. 4A and 4B is first implemented. Following implementation of, for example, the division of the IC 418 into horizontal strips such as horizontal strips 422, the horizontal strips are then divided into grid cells strictly along the opposite axis, the vertical axis. This is done by dividing the horizontal strips vertically, to create a number of cells each containing the same number of flops. For example, FIG. 4C includes grid cells 424 and 426. As shown, grid cell 426 is narrower than grid cell 424. Therefore, it should be understood that the grid cell 426 includes a region having a higher flop density than the flop density in grid cell 424. Grid cells 424 and 426 each indicate an area inside of which compression logic and decompression logic is placed for distribution to localized flops. The grid cells shown do not indicate actual physical division of the IC into separate pieces but instead indicate a hypothetical dividing line over which wiring for scan chain connections to CoDecs cannot cross. Similarly, following implementation of the IC 402 into vertical strips, the vertical strips are then divided into grid cells. This is done by dividing the vertical strips horizontally, to create a number of cells each containing the same number of flops. In some embodiments, when flops are distributed unevenly about IC 402, the end result is that the grid is extremely uneven and difficult to wire.

FIG. 4D illustrates a 2-dimensional logic intensive distribution scheme for a CoDec. In FIG. 4D, the IC is divided according to a k-means method. In accordance with the method, the chip is divided into cells. As shown in the first part of FIG. 4D, IC 428 is divided into grid cells, including grid cell 430. Initial division of the IC 428 into grid cells is arbitrary. Although in FIG. 4D, the initial division shows the IC 428 divided into grid cells of equal size, this is not necessarily the case. After division of the chip into cells, an iterative process 432 is applied to morph the boxes into different shapes to get the optimal shape for distribution of the CoDec logic. As shown in the second part of FIG. 4D, and after the iterative process 432 is applied to the IC 428, the chips is divided into grid cells of different sizes. For example, after the k-means method is complete, IC 428 includes grid cells 436 and 434. Grid cells 434 and 436 are of different lengths and different widths. Grid cells 434 and 436 each indicate an area inside of which compression logic and decompression logic is placed for distribution to localized flops. The grid cells shown do not indicate actual physical division of the IC into separate pieces but instead indicate a hypothetical dividing line over which wiring for scan chain connections to CoDecs cannot cross. However, implementation of the k-means method requires that a processing device solves an optimization problem based on the convergence of a complex algorithm. Accordingly, the time and processing power used to solve the optimization problem is often greater than the time and processing power available for the determination.

As described with reference to FIGS. 4A to 4D, dividing an IC does not mean physically dividing the IC into different pieces. Instead, division of the IC refers to the formation of the boundary of imaginary cells over the surface of the IC. When an IC is divided into horizontal strips, for example, imaginary dividing lines that delimit the boundaries of the cells are formed along the horizontal lines. The resulting horizontal strips between the dividing lines each include a number of flops, and all of the flops within a horizontal strip are serviced by the same compression and decompression logic. Accordingly, all of the decompression and compression logic wiring leading to and from any flop on the chip is performed within the boundaries of the imaginary cell created by the division procedure.

As can be appreciated from the foregoing, there is a need for construction of an imaginary grid, on the IC, before implementation of the XOR Tree compression and decompression logic, where the logic from the CoDec can be distributed evenly to points on a grid. The foregoing methods described in FIG. 4A to 4D can be used to form such a grid. Structuring a grid capable of an even distribution with minimal processing power is further described in detail in the above-referenced application, Ser. No. 14/738,746 ("Method for Dividing Testable Logic into a Two-Dimensional Grid for Physically Efficient Scan"). Evenly distributing the CoDec to points on a grid means that, at each location in the IC, the output/input of the CoDec is provided to and unloaded from the same number of flops for testing scan chains. The problem is complex because the grid cells cannot simply be distributed according to an even distribution of grid cells that could be determined with the use of a ruler or another basic dividing apparatus. This is because some parts of the chips have large numbers of flops and other parts of the chip have small numbers of flops, which create high flop density areas and low flop density areas. Each grid cell constructed must have the same number of flops within its bounds. Within each grid cell, a scan chain is formed by connections between the flops. When each grid cell contains scan chains of the same length, then all of the scan in data distributed to the scan chains in the grid cells via the decompression logic can be of the same length. If the scan chains vary in sizes across the grid cells, then the process of loading scan in data results in an additional number of clock cycles. If the chains are uneven, the additional number of clock cycles is being performed for at least some null sets of data. If all of the scan chains are the same length, then the TAT is optimized and distribution of the volume of test data is optimized.

Figure 5:
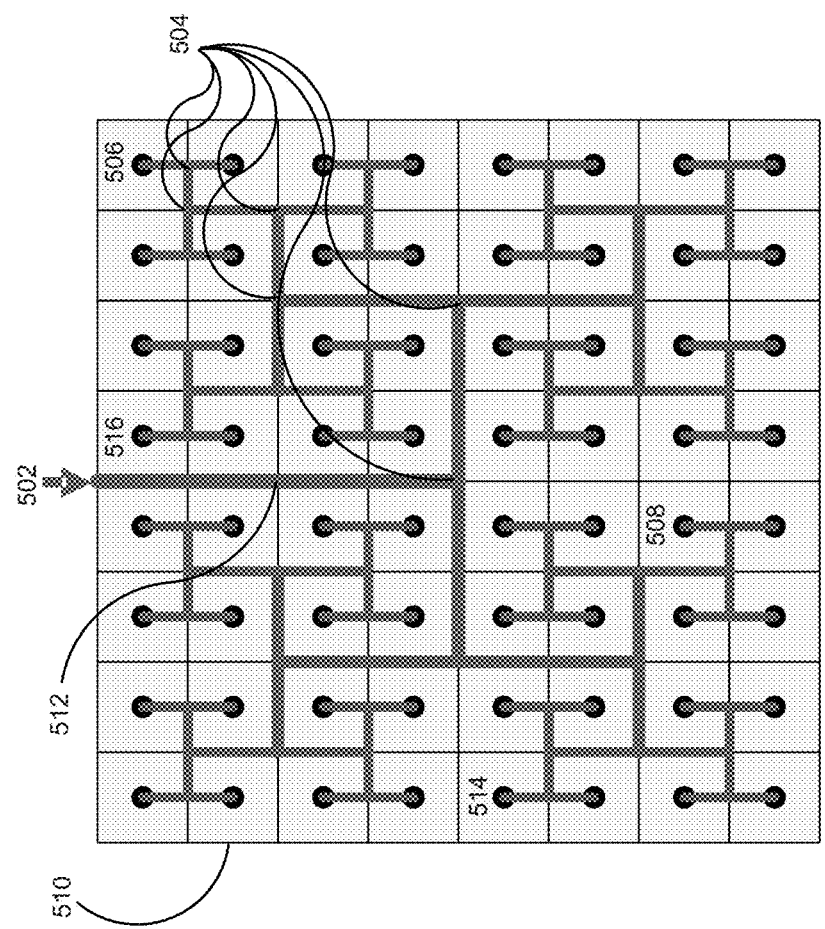
FIG. 5 illustrates an implementation of the XOR tree distribution scheme for a CoDec.

FIG. 5 illustrates an implementation of the XOR tree distribution scheme for a CoDec. When using an XOR tree, such as the one shown in FIG. 5, scan input data can be provided to various regions of the IC 510 in order to provide that test data to scan chains. In some embodiments, the XOR Tree shown in FIG. 5 is implemented to act as a decompressor. By using the XOR tree, the scan input data is loaded, and channeled through the region noted by 502. The compressed input stream of scan input data is propagated along the first signal 512 until it reaches a node, which is a region in which the signal splits into two separate paths. For example, each of the areas designated by 504 is a node. To implement the XOR tree distribution, XOR functionality is used to split the scan input data at the nodes in accordance with the below described method. Therefore, at each of the nodes in an XOR tree, XOR logic gates are used to decompress the scan input data and propagate the data to respective regions of the XOR tree. When the signal ends, and is no longer propagated, that particular portion of the XOR tree is designated as a leaf, which provides data to the scan chain in a respective grid cell for scanning. Accordingly, to implement the decompression logic, a grid should be structured over the surface area of the IC with an XOR leaf in each of the grid cells. Each of regions 506, 508, 514, and 516 includes a respective leaf. With specific reference to the grid cell including leaf 506, it is noted that scan input data is propagated and decompressed through 6 nodes, each of which is notated by 504.

FIG. 5 similarly illustrates the layout needed for implementation of an XOR Tree as a compressor. By using the XOR tree, the test response data is loaded at each leaf (e.g., 506, 508, 514, 516), and channeled along the branches of the tree in the direction of exit communication line 502. The test response data is compressed at each node of the communication line 512. Nodes in XOR Tree compressors are described in the same manner as above with regard to the XOR Tree decompressor. A node is a region in which the communication line splits into two separate paths. To implement the XOR tree compression method, XOR functionality is used to combine the test response data being returned from each leaf through the nodes in accordance with the below described method. Therefore, at each of the nodes in an XOR tree, XOR logic gates are used to compress the test response data and propagate the data to the output of the communication line at 502. At the end of the tree, the compressed test response data is provided to M scan out pins for analysis to determine whether or not there is a fault in any particular region of the IC. It is noted that test response data is propagated and compressed through 6 nodes between a leaf 506 and output to M scan pins at 502, each of which is notated by 504.

Figure 6:
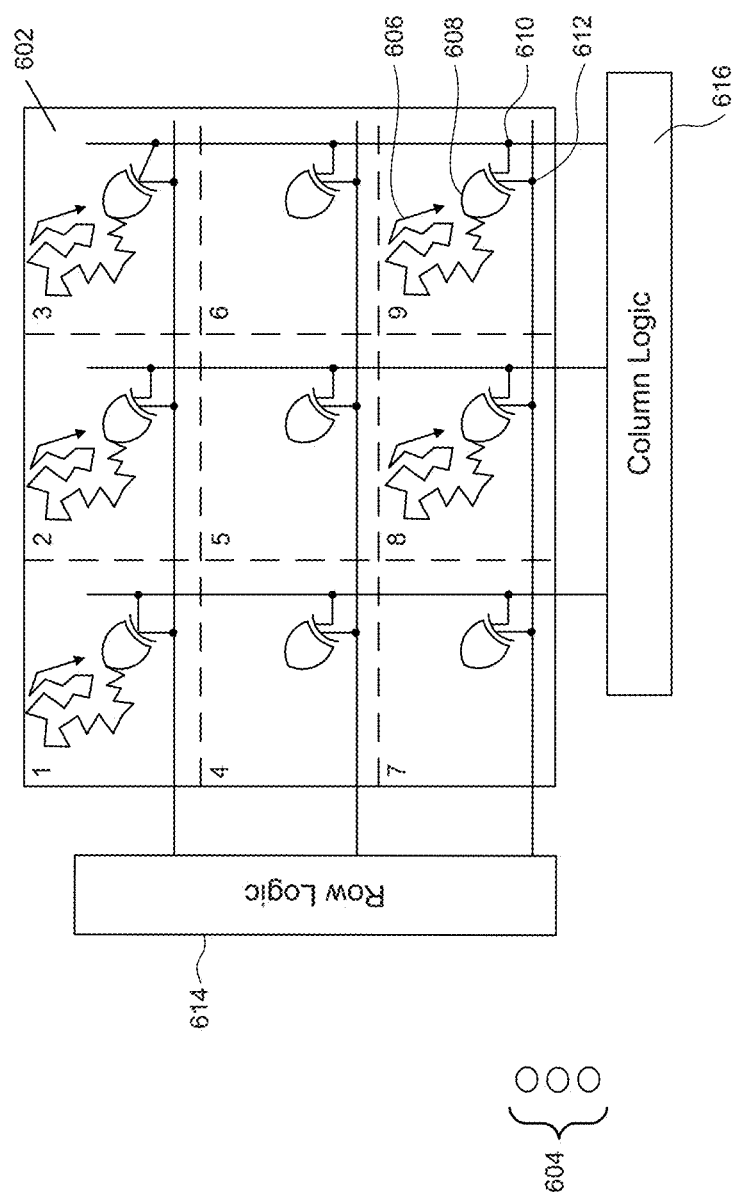
FIG. 6 illustrates an embodiment of an IC having a distributed Decompressor as part of its CoDec.

FIG. 6 illustrates an embodiment of an IC having a sequentially distributed Decompressor, as part of its CoDec. In FIG. 6, IC 602 is partitioned into a number of regions (1, 2, 3, 4, 5, 6, 7, 8, 9). The sequentially distributed Decompressor allows for the IC 602 to be partitioned into a grid of Y by X boxes, with some of the decompression logic in each of the boxes. In IC 602 shown in FIG. 6, the grid is 3 boxes wide and 3 boxes long. In order to implement the sequentially distributed Decompressor, the final XOR stage is implemented so that there are localized XOR gates in each of the boxes. Each XOR, in each box, provides test stimuli from the M pins in 604 to the scan chains (e.g., 606) located within a respective box on the IC 602. Each XOR has a wire feeding from the horizontal direction (e.g., 612), from a row of decoding logic 614. Each XOR further has a wire feeding from the vertical direction (e.g., 610), from a column of decoding logic 616. The XOR (e.g., 608) then accepts the wire from the horizontal direction 612 and the wire from the vertical direction 610 as inputs into its gate 608. The output of the XOR is provided to its respective scan chain (e.g., 606) in the grid cell. In an embodiment, the grid cell includes more than one scan chain that receives the output of the XOR gate. In so doing, a unique piece of data is provided for each grid cell. The distribution of the XOR gates and the division of the grid, in an embodiment, covers the entire IC 602 area. In another embodiment, the distribution of the XOR gates and the division of the grid covers an area less than the entire IC 602 area.

Figure 7:
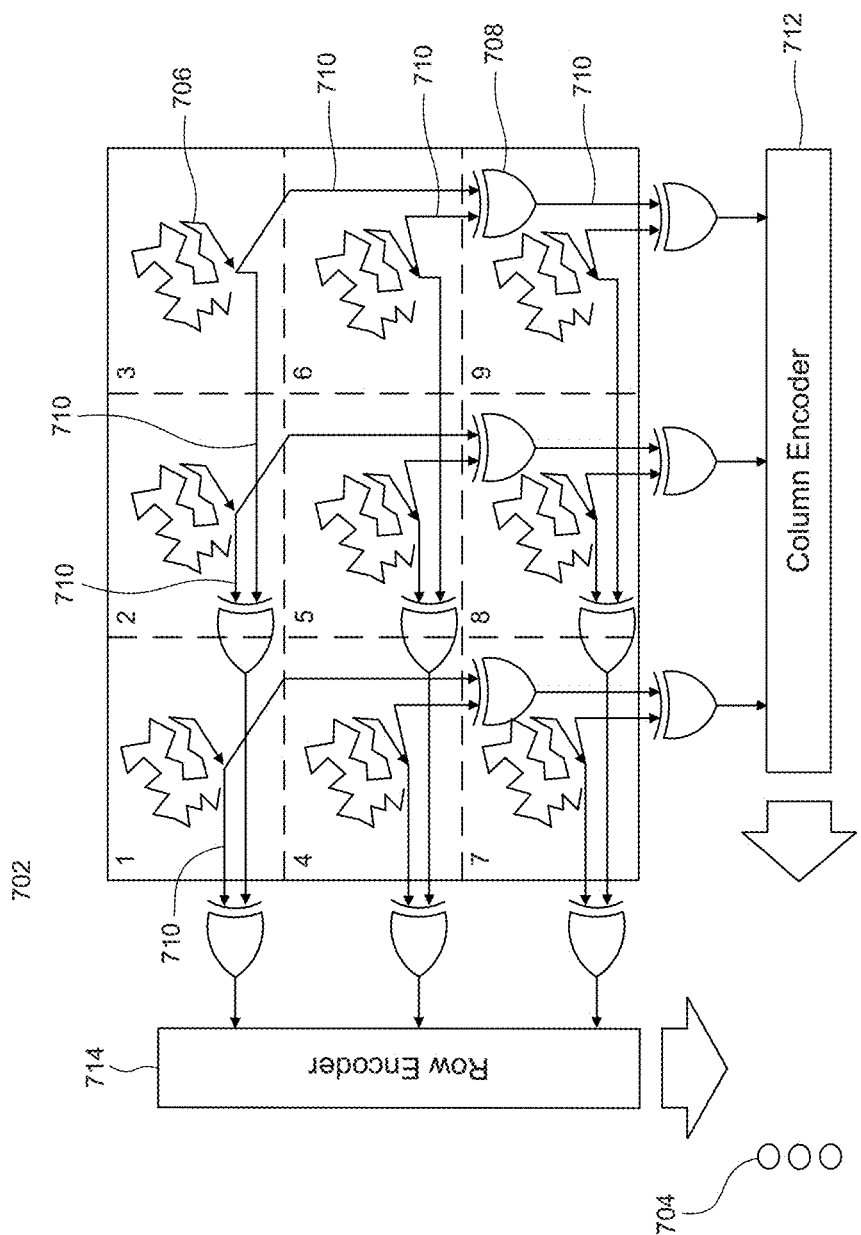
FIG. 7 illustrates an embodiment of an IC having a distributed Compressor as part of its CoDec.

FIG. 7 illustrates an embodiment of an IC having a Compressor as part of its CoDec. In FIG. 7, IC 702 is partitioned into a number of regions (1, 2, 3, 4, 5, 6, 7, 8, 9). The Compressor allows for the IC 702 to be partitioned into a grid of Y by X boxes, with some of the compression logic in each of the boxes. In IC 702 shown in FIG. 7, Y is 3 boxes wide and X is 3 boxes long. In order to implement the Compressor, a first XOR stage is implemented such that the outputs of the scan chains are cascaded. Scan chains are XOR'd with other scan chains. The XOR gates are located on the chip in their respective columns either between scan chains 710 or proximately located to its associated scan chain. Starting at one end of the chip, along each column, the scan chains in the column are XOR'd with other scan chains in the same column in a cascading fashion away from the end of the chip. Additional XOR gates are located on the chip in their respective rows either in between scan chains 710 or proximately located to its associated its scan chain. Starting at the end of the chip next to the end selected for the columns, along each row, the scan chains in the row are XOR'd with other scan chains in the same row in a cascading fashion away from the end of the chip.

As noted in FIG. 7, regions 4, 5, 7, and 8 each contain two XOR gates while regions 1, 2, 6, and 9 each contain a single XOR gate and region 3 contains zero XOR gates. Based on the side selected for the top of the column XOR cascades and the side selected for the top of the row XOR cascades, the locations of the number of XOR gates can be rotated 90 degrees, 180 degrees, or 270 degrees. In an embodiment, the corner that rests between the side selected for the top of the column XOR cascades and the top of the row XOR cascades will be the grid cell without the XOR gates. In an embodiment, the grid cells in contact with the sides selected for the top of the column cascades and the top of the row cascades (with the exception being the cornermost grid cell) will be the grid cells with only one XOR gate.

In an embodiment, the Decompressor of FIG. 6 and the Compressor of FIG. 7 can be used together to provide M scan in pins of test stimuli to N scan chains and then decode the test response data returned from the N scan chains to the M input pins. In an embodiment, the partitioned regions for the Compressor are the same partitioned regions designated for the sequentially distributed Decompressor. In an embodiment, the sequentially distributed Decompressor and the Compressor are capable of being used in conjunction as a CoDec.

However, there are limitations to the construction of the CoDec shown in FIGS. 6 and 7. For the compressor structure, as shown in FIG. 7, long rows and columns of the wire, each having an associated XOR gate, require that each wire go through numerous gates before reaching an edge for decoding. Especially on the compression side of the traditional CoDec, the TAT can be large due to inherent limitations of cascaded XOR gates over the grid. The XOR Tree CoDec, described above with reference to FIG. 5 and in the following examples, provides a solution to TAT associated with the traditional CoDec. Specifically, the XOR Tree CoDec only requires that data being loaded onto or off of a grid is propagated through $\log_2(N)$ nodes, each of which have combinational logic, and where N is the number of cells in the grid. The CoDec implementation described in FIGS. 5 and 6 required propagation of data being loaded off of a grid through approximately 0.5*sqrt(N) nodes, each of which have combinational logic, and where N is the number of cells in the grid. Accordingly, in an 8 by 8 cell grid, the traditional CoDec would require that data travel through an average number of 4 nodes (e.g., 0.5*sqrt(64)). It should be noted that using the traditional CoDec, some of the data loaded into the 8 by 8 cell grid would propagate through only 1 node, while other data would propagate through 8 nodes. On the same grid, the XOR Tree CoDec requires that each element of data loaded travel through 6 nodes (e.g., $\log_2(64)$). However, the overall benefit generated by the XOR Tree CoDec can be better understood as the size of the grid increases. For instance, in a 64 by 64 cell grid, the traditional CoDec would require that data travel through an average number of 32 nodes (e.g., 0.5*sqrt(4096)). It should be noted that using the traditional CoDec, some of the data loaded into the 64 by 64 cell grid would propagate through only 1 node, while other data would propagate through 64 nodes. On the same grid, the XOR Tree CoDec requires that each element of data loaded travel through 12 nodes (e.g., $\log_2(4096)$). As chip complexity increases and the required number of scan chains increases, the benefits available through usage of the XOR Tree CoDec become more apparent. Moreover, provided that time is associated with latching data through the XOR gates at all of the above-described nodes, the XOR Tree CoDec saves test time.

Figure 8:
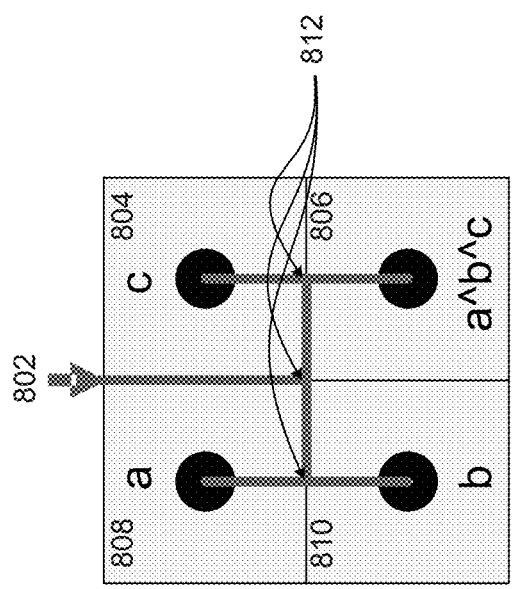
FIG. 8 illustrates an embodiment of an IC with testable logic provided onto a 2-dimensional grid according to the XOR tree distribution scheme for a CoDec.

FIG. 8 illustrates an embodiment of an IC with testable logic provided onto a 2-dimensional grid according to the XOR tree distribution scheme for a CoDec. When M scan inputs are provided for decompression, the number of resulting terms through XOR decompression, N, are equal to $2^{M-1}$. The resulting terms used in XOR decompression include the odd terms, only. Therefore, when 3 scan inputs are provided, (e.g., a, b, c), the number of resulting terms made available to test the scan chains is $2^{3-1}=4$. The resulting terms include the terms: a (808), b (810), c (804), and a^b^c (806). The 3 scan inputs are propagated over the communication line from connection position 802. Three nodes 812 are used to decompress the M scan inputs to the N cells.

Figure 9:
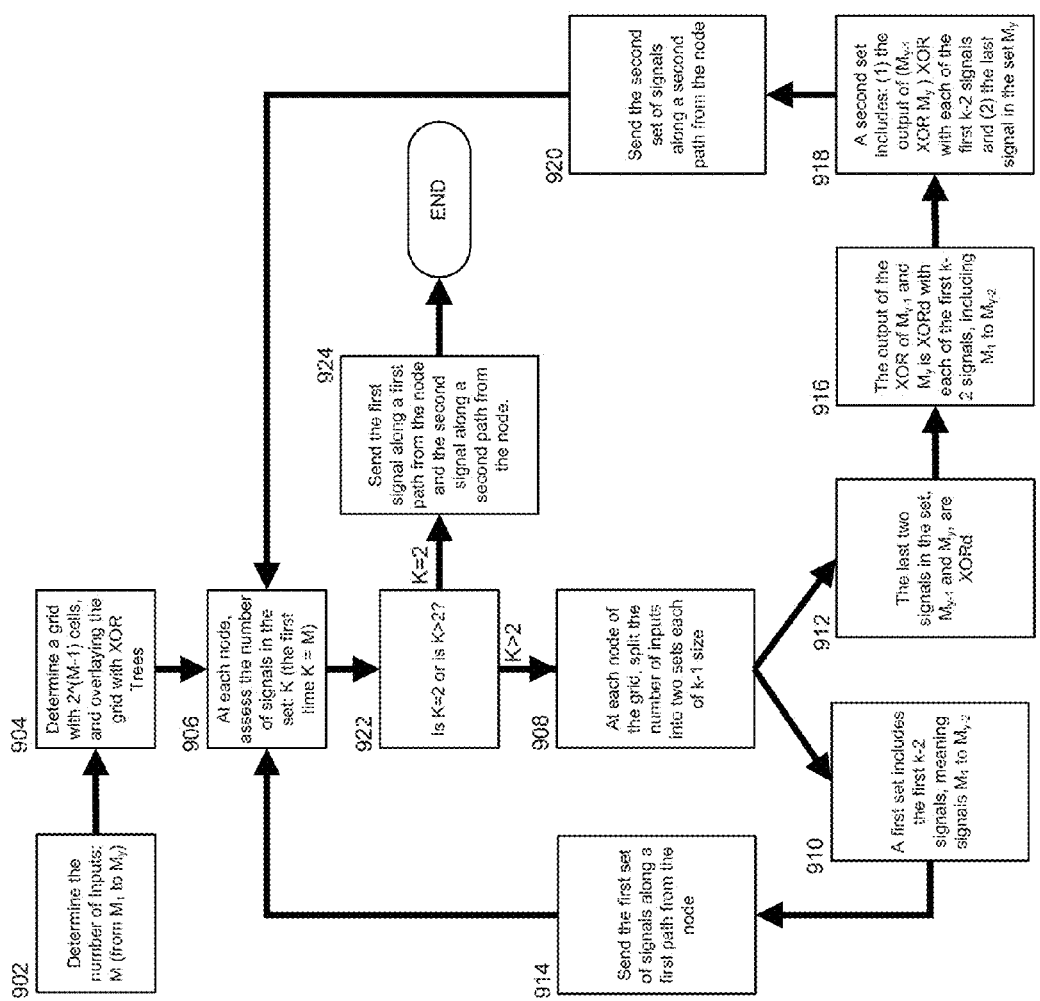
FIG. 9 illustrates a flowchart describing the algorithm to provide decompression logic using the XOR trees.

FIG. 9 illustrates a flowchart describing the algorithm to provide decompression logic using the XOR trees. The method begins at 902 by determining the number of scan inputs M (which include $M_1$ to $M_y$). At 904, an IC is overlaid with scan chains for manufacturing tests in accordance with a grid that has $2^{M-1}$ cells. An XOR tree wiring decompression logic scheme is then laid over the grid. At 906, along a distribution path, and at a first node in the path, the number of signals, "K," in the set is assessed. On a first iteration, at 906, K=M. At 922, it is determined whether K is greater than 2. During a first iteration, unless M=2, flow goes past 922 to 908. After K is determined, the wiring is split at the node such that there are two resulting groups of signals. At 910, a first group includes the first k-2 signals. At 914, this first group is directed down a first path from the node. The first k-2 signals are signals $K_1$ to $K_{y-2}$. At 912, a second group directed down a second path from the node includes k-2 signals total. The k-2 signals in the second group are formulated at 912 to 918. At 912, the last two signals in the signal set, $K_{y-1}$ and $K_y$, are provided as input to an XOR gate. At 916, the output of the XOR gate is XOR'd with each of the first k-2 signals, which includes $K_1$ to $K_{y-2}$. At 918, the output from the XORs from step 916 is then included in the second set of signals, along with the last signal in the set $K_y$. At 920, the second group is directed down a second path from the node. The process then is iterative, at every node, with the procedure beginning anew from 906. Returning to 922, which follows the assessment of the number of signals at a node, it is determined whether K=2. If K=2 (e.g., a^c^d and b^c^d), then the method proceeds to 924, where each of the signals is directed along a respective path away from the node. After 924, the M scan inputs have been decompressed to the extent possible, with one of each of the grid cells receiving an odd number of XOR terms based on the M scan inputs for application to a respective scan chain.

FIGS. 10A-B illustrate an embodiment of testable logic being split over a small grid applied to an IC according to decompression logic implemented by the XOR tree distribution scheme. As described with reference to FIG. 8, FIG. 10A shows XOR tree decompression logic applied to three terms: a, b, and c. The M scan inputs a, b, and c, are applied to the XOR tree decompression logic at connection position 1002. Further detail regarding the manner in which the scan inputs are decompressed from connection position 1002 to each of the grid cells now will be described. At a first node, 1012, the three scan input signals are split into two groups. The first group includes a and b. The first group of a and b is split in the direction of node 1014, after which the input signals are split again into two groups: a first group including only a in grid cell 1008; and a second group including only b in grid cell 1010. The second group is formed by following the steps 912, 916, and 918 in FIG. 9 and therefore includes: a^b^c and c. The second group of c and a^b^c is split in the direction of node 1016, after which the signals are split again into two groups: a first group including only c in grid cell 1004; and a second group including only a^b^c in grid cell 1006.

FIG. 10B provides more detail regarding how the XOR decompression is implemented at the nodes. At node 1012, the logic associated with portion 1018 of the tree diagram is implemented. At the first node, k is M, so k is 3. Node 1012 splits the 3 inputs into two sets of terms, each including 2 terms (k-1). The signals are divided such that the first group 1022 includes the first k-1 original signals: a and b. The second group 1024 includes: 1) the first k-2 signals (a) XOR'd with the last two signals in the set (b and c); and 2) the last signal (c). At nodes 1014 and 1016, the logic associated with portion 1020 of the tree diagram is implemented. At node 1014, the first group 1022 is split into two grid cells. In accordance with the decompression method, as only two inputs remain, one goes to each of the grid cells. Output a 1026 goes to grid cell 1008 and output b 1028 goes to grid cell 1010. At node 1016, the second group 1024 is split to two grid cells. In accordance with the decompression method, as only two inputs remain, one goes to each of the grid cells. Output 1030 goes to grid cell 1006 and output c 1032 goes to grid cell 1004.

FIGS. 11A-B illustrate an embodiment of testable logic being split over a larger grid applied to the IC according to decompression logic implemented by the XOR tree distribution scheme. FIG. 11A shows XOR tree decompression logic applied to four input terms: a, b, c, and d. The M scan inputs a, b, c, and d are applied to the XOR tree decompression logic at connection position 1102. Further detail regarding the manner in which the scan inputs are decompressed from connection path 1102 to each of the grid cells now will be described. At a first node, 1104, the four scan inputs are split into two groups. The first group includes: a, b, and c. The first group of a, b, and c is split in the direction of node 1108. At first node 1104, the second group is split in the direction of node 1106 and includes a^c^d, b^c^d, and d. At node 1108, the first group is further split into two groups including: a first group having a and b directed towards node 1112, and a second group having c and a^b^c directed towards node 1110. At node 1106, the second group is further split into two groups including: a first group having a^c^d and b^c^d directed towards node 1114, and a second group having a^b^d and d directed towards node 1116. At these final nodes: 1112, 1110, 1114, and 1106, only two signal remain, and the two signals each split into a respective direction.

FIG. 11B provides more detail regarding how the decompression is implemented at the nodes. At node 1104, the logic associated with portion 1118 of the tree diagram is implemented. At the first node, k is M, so k is 4. Node 1104 splits the 4 inputs into two sets of terms, each including 3 terms (k-1). The signals are divided such that the first group 1028 includes the first k-1 original signals: a, b, and c. The second group 1130 includes: 1) the first k-2 signals (a and b) XOR'd with the last two signals in the set (c and d); and 2) the last signal (d). At nodes 1108 and 1106, the logic associated with portions 1120 and 1122 of the tree diagram is implemented. At node 1108, the algorithm is repeated with k=3, since only 3 terms remain. The group 1128 is split such that there are two sets of terms, each including 2 terms (k−1). The signals are divided such that the first group 1132 includes: the first k−1 original signals: a and b. The second group 1134 includes: 1) the first k−2 signals (a) XOR'd with the last two signals in the set (b and c); and the last signal in the set (c). At node 1106, the algorithm is repeated with k=3, since only 3 terms remain. The group 1130 is split such that there are two sets of terms, each including 2 terms (k−1). The signals are divided such that the first group 1136 includes: the first k−1 original signals aˆcˆd and bˆcˆd. The second group 1138 includes: 1) the first k−2 signals (aˆcˆd and bˆcˆd) XOR'd with the last two signals in the set (bˆcˆd and d); and 2) the last signal (d). Portion 1124 of the tree diagram occurs at the final node for each of the signals. At each of nodes 1112 and 1110 a respective group is split into two grid cells. The group splitting occurs in accordance with the decompression method, as only two inputs remain, one going to each of the grid cells. For example, at node 1112, group 1132, which includes only signals: a and b, each of a and b is split to a respective grid cell. A first grid cell includes only signal 1140, and a second grid cell includes only 1142. Similarly, portion 1126 of the tree diagram occurs at the final node for each of the signals. At each of nodes 1116 and 1114 a respective group is split into two grid cells. For example, at node 1116, group 1138, which includes only signals aˆbˆd and d, each of aˆbˆd and d is split into a respective grid cell. A first grid cell includes only signal 1144, and a second grid cell includes only signal 1146.

Figure 12:
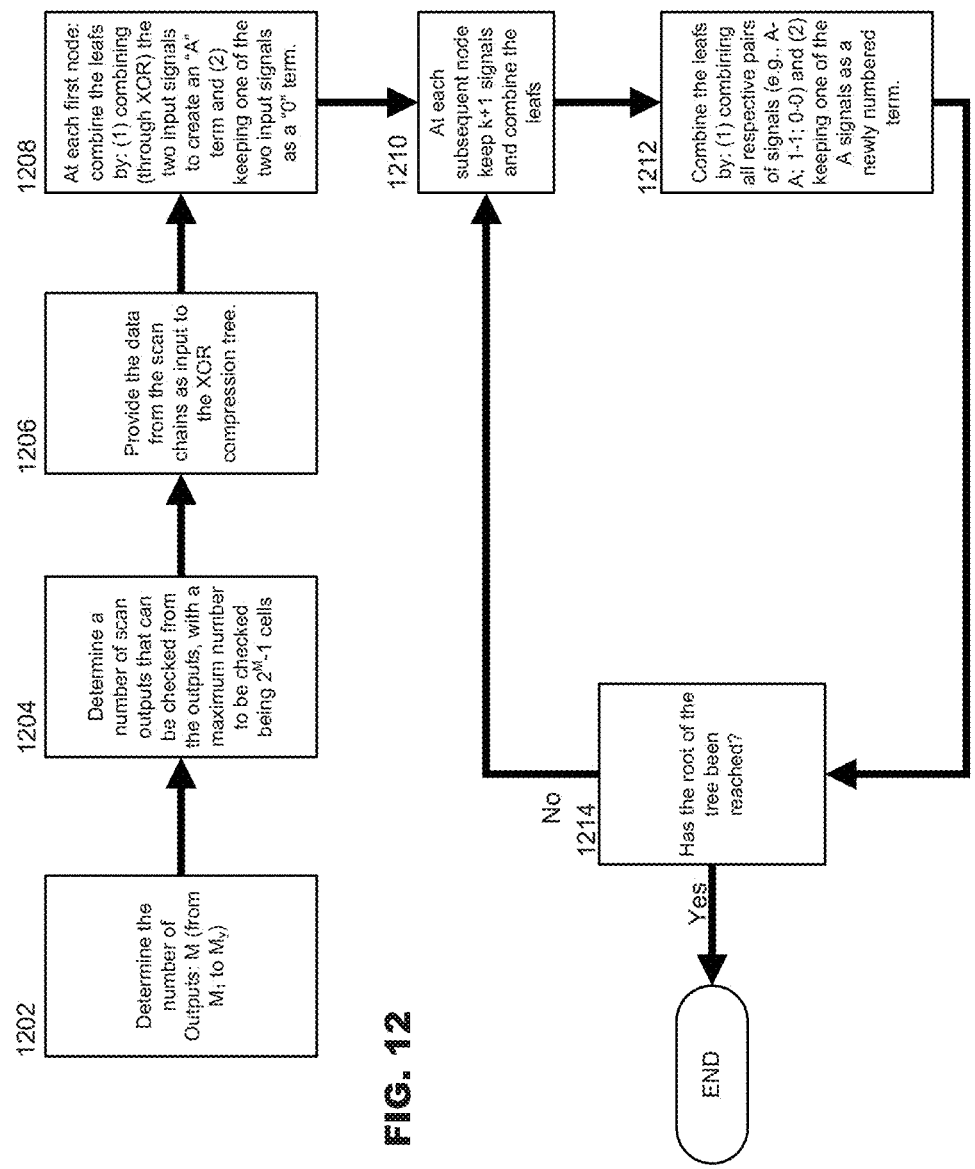
FIG. 12 illustrates a flowchart describing an algorithm to provide compression logic using the XOR trees.

FIG. 12 is a flowchart describing the algorithm to provide compression logic using the XOR trees. At 1202, the number of available scan out pins, M, is determined. Following the determination of the number of available scan out pins, at 1204, a number of scan chains to be observed is determined. $2^M-1$ cells represents the total number of scan chains that can be observed for fault detection, but the actual number of scan chains observed can be less than the total number of scan chains, according to user choice. In some embodiments, a grid shape is known to extend over the surface area of the IC so as to include $2^M-1$ cells. In some embodiments, the known grid shape is overlaid with XOR Trees such that one leaf of the XOR tree is in each of, or most of, the determined grid cells. At 1206, the data is loaded from the scan chains onto the leaves at the endpoints of the XOR compression tree. At 1208, at each first node, which is the node in closest proximity to a leaf of the XOR tree, a first signal including test response data from a scan chain is combined with a second signal including test response data from a second scan chain. The test response data is combined by: combining, through an XOR gate or XOR logic, the two input signals to create an "A" (or "All") term. The test response data is further combined by keeping, as an extra bit, one of the two input signals as a "0" term. The first signal and the second signal are generated from different communication paths, or branches, received by the node.

As described at 1210, the resultant combination is expanded from a k bit set to a k+1 bit set (e.g., two two-bit sets {A, 0} are combined to create a one three-bit set {A, 1, 0}). The expansion is performed, in each subsequent node, as described in 1212. The leads are combined by: 1) combining all respective bit pairs of signals (e.g., A bits are combined with A bits; 1 bits are combined with 1 bits; and 0 bits are combined with 0 bits), and 2) keeping, as an extra bit, one of the previously labeled A signals as a newly numbered term (i.e., two three-bit sets {A, 1, 0} are combined to create one four-bit set {A, 2, 1, 0} where the "2" term is one of the previously presented "A" terms from one of the two three-bit sets).

Therefore, if the terms to be combined are each: {A, 5, 4, 3, 2, 1, 0}, then the combined terms result in: {A, Q, 5, 4, 3, 2, 1, 0}, where Q is the "A" term from one of the {A, 5, 4, 3, 2, 1, 0} sets. The selection of which set contributes its "A" term, from either the first set or the second set, can be arbitrary. In some embodiments, the selection of the "A" term is according to product specifications and built into the hardware. After the test response data set has been generated, at 1214 there is a check whether the root of the XOR compression tree has been reached. In some embodiments, the root of the tree is determined to have been reached when the number of output terms is equal to M expected scan out bits. For example, the number of output terms in {A, 6, 5, 4, 3, 2, 1, 0} is 8. If M equals 8 then the method ends. If M does not equal the number of output terms (8 in this example), the method begins again and loops back to 1210. In some embodiments, there is no need to determine the end of the method because the data will automatically be presented for decoding at the scan out pins.

FIGS. 13A-C illustrate an embodiment of test results from a small grid on an IC being compressed and decoded using the XOR tree distribution. FIG. 13A illustrates aspects of a method for combining test response data from the scan chains on the grid to scan out data M. As can be seen, there are three scan out pins: A, 1, and 0. Therefore, the number of scan chains that must be combined in order to create M scan out pins are to be selected, one from each grid cell, from a grid that has $2^M-1$ cells. As shown in FIG. 13A, test response data is collected from four scan chains to get the correct number of scan out pins. As shown, the test response data collected includes: a, b, c, and d. When the number of grid cells to be sampled is odd (e.g., in a 3 by 3 grid), the annotation of "no" indicates that the specific input available cannot be used and "no" is used as a placeholder, or an artificial extra term which is equal to logic zero. Where scan out pins available equals M, test response data over $2^M-1$ scan chains can be removed through the M scan out pins. As an example, if 2 scan out pins are available as shown, test response data over 4 scan chains can be removed from the grid. If there is one scan chain per grid cell, this is equivalent to 4 grid cells. In portion 1322 of the XOR tree compression flow chart, test response data from a first leaf of the XOR tree is provided as a, which is size K=1, and test response data from a second leaf of the XOR tree is provided as b, which is also size K=1. In accordance with aspects of the method, these two sets of data, each of size K=1 are combined to make a data set of K+1=2. The resultant data set includes: a XOR'd with b as a most significant bit of the result, and the test response data from the second leaf, b, as a second most significant bit of the result. Also in portion 1322 of the XOR tree compression flow chart, test response data from a first leaf of the XOR tree is provided as c, which is size K=1, and test response data from a second leaf of the XOR tree is provided as d, which is also size K=1. In accordance with the method, these two sets of data, each of size K=1 are combined to make a data set of K+1=2. The resultant data set includes: c XOR'd with d as a most significant bit of the result, and the test response data from the second leaf, d, as a second most significant bit of the result. In a subsequent portion 1324 of the XOR tree compression flow chart, test response data from a first node of the XOR tree is provided as {A, 0} and test response data from a second node of the XOR tree is provided as {A,0}. In accordance with aspects of the method, each of the data sets is size K=2, and they are combined to generate a resultant set of K+1=3. The resultant data set includes: {A XOR'd with A, the most significant bit of the test response data from the second node, 0 XOR'd with 0}. The resultant data set, in shorthand becomes {A, 1, 0}. Of the resultant data set, the subset {1,0} provides information regarding the location of a fault in the grid and an associated scan chain.

FIG. 13B illustrates aspects of a method for determining, from the XOR tree compressed scan out data, the location of a fault on a grid hosting the XOR tree. A first column 1320 lists the inputs (a, b, c, d). A second column 1318 lists the encoded output {1,0}, which would be provided from the scan out data by aspects of the XOR tree compression method. By matching actual output bits from step 1324 with an encoded output option in column 1318, an associated input 1320 can be determined. The input 1320 associated with an indicated encoded output is determined to include a fault. Consequently, the fault can be traced back to a particular region of a grid over which the XOR tree compressor is overlaid. In some embodiments, the fault can be traced back to a particular scan chain of a grid over which the XOR tree compressor is overlaid. For example, if the output data set {1,0} returned values (1,0), this would indicate that the portion of the grid associated with "c" had a fault.

FIG. 13C illustrates a grid overlaid with XOR tree compression logic. Response data is loaded off scan chains at leaves 1304, 1306, 1308, and 1310. For shorthand, the data loaded off leaf 1304 is "c"; the data loaded off leaf 1306 is "d"; the data loaded off leaf 1310 is "b"; and the data loaded off leaf 1308 is "a". At node 1316, the compression logic method XORs a and b, as described above with reference to FIG. 13A. The two resulting outputs from that combination are {A, 0}. At node 1312, the compression logic method XORs c and d, as described above with reference to FIG. 13A. The two resulting outputs from that combination are {A, 0}. At node 1314, the compression logic method XORs the two sets of two outputs {A, 0} and {A, 0}, which results in a signal having three outputs {A, 1, 0}, with one resultant unknown MSB. If subset {1,0} of the data read off onto scan out pins included output data (1,1), this would indicate that data from "d", or region 1310 included faulty data. In some embodiments, this would indicate that at least one flop on a scan chain associated with region 1310 of the IC had failed. In some embodiments, a fault could result from some other manufacturing defect realized on that particular region of the IC.

Figure 14B:
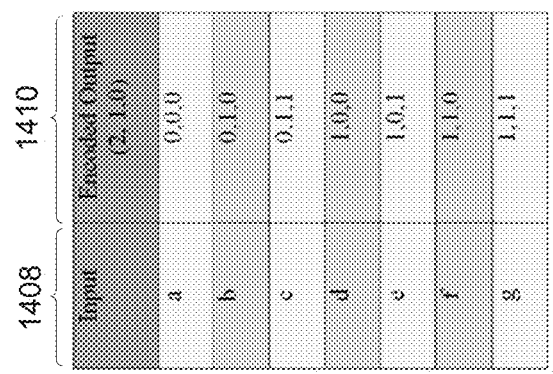
FIG. 14B illustrates an embodiment of a method for determining, from the compressed test results provided by a medium grid on an IC, a location of a fault on the grid using the XOR tree distribution.
Figure 14A:
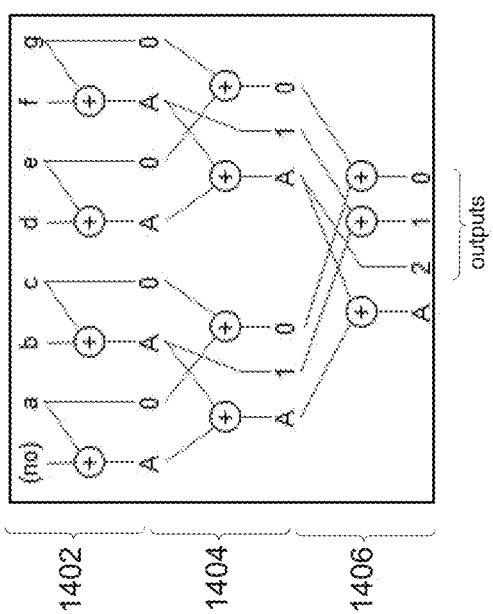
FIG. 14A illustrates an embodiment of a method for compressing test results from a medium grid on an IC using the XOR tree distribution.

FIG. 14 illustrates an embodiment of test results from a medium grid on an IC being compressed and decoded using the XOR tree distribution. FIG. 14A illustrates the method for combining test response data from the scan chains on the grid to scan out data M. As can be seen, the number of scan out pins is 3: A, 2, 1, and 0. Therefore, the number of scan chains that must be combined in order to create M scan out pins are to be selected, one from each grid cell, from a grid that has $2^M-1$ cells. As $2^3-1$ equals 7, test response data collected from seven scan chains (or eight scan chains, with one "unknown" scan chain) on different portions of the grid must be compiled to get the correct number of scan out pins. As shown, the test response data collected includes: (no), a, b, c, d, e, f, and g.

In portion 1402 of the XOR tree compression flow chart, test response data from a first leaf of the XOR tree is provided as (no), which is size K=1, and test response data from a second leaf of the XOR tree is provided as a, which is also size K=1. In accordance with the method, these two sets of data, each of size K=1 are combined to make a data set of K+1=2. The resultant data set includes: (no) XOR'd with a as a most significant bit of the result, and the test response data from the second leaf, a, as a second most significant bit of the result. Also in portion 1402 of the XOR tree compression flow chart, test response data from a first leaf of the XOR tree is provided as b, which is size K=1, and test response data from a second leaf of the XOR tree is provided as c, which is also size K=1. In accordance with the method, these two sets of data, each of size K=1 are combined to make a data set of K+1=2. The resultant data set includes: b XOR'd with c as a most significant bit of the result, and the test response data from the second leaf, c, as a second most significant bit of the result. Also in portion 1402 of the XOR tree compression flow chart, test response data from a first leaf of the XOR tree is provided as d, which is size K=1, and test response data from a second leaf of the XOR tree is provided as e, which is also size K=1. In accordance with the method, these two sets of data, each of size K=1 are combined to make a data set of K+1=2. The resultant data set includes: d XOR'd with e as a most significant bit of the result, and the test response data from the second leaf, e, as a second most significant bit of the result. Also in portion 1402 of the XOR tree compression flow chart, test response data from a first leaf of the XOR tree is provided as f, which is size K=1, and test response data from a second leaf of the XOR tree is provided as g, which is also size K=1. In accordance with the method, these two sets of data, each of size K=1 are combined to make a data set of K+1=2. The resultant data set includes: f XOR'd with g as a most significant bit of the result, and the test response data from the second leaf, g, as a second most significant bit of the result In a subsequent portion 1404 of the XOR tree compression flow chart, test response data from a first node of the XOR tree is provided as {A, 0} and test response data from a second node of the XOR tree is provided as {A,0}. In accordance with the method, each of the data sets is size K=2, and they are combined to generate a resultant set of K+1=3. The resultant data set includes: {A XOR'd with A, the most significant bit of the test response data from the second node, 0 XOR'd with 0}. The resultant data set, in shorthand becomes {A, 1, 0}. The procedure is repeated for each of the second nodes along the XOR tree encountered.

In a subsequent portion 1406 of the XOR tree compression flow chart, test response data from a first node of the XOR tree is provided as {A,1, 0} and test response data from a second node of the XOR tree is provided as {A,1, 0}. In accordance with the method, each of the data sets is size K=3, and they are combined to generate a resultant set of K+1=4. The resultant data set includes: {A XOR'd with A, the most significant bit of the test response data from the second node, 1 XOR'd with 1, 0 XOR'd with 0}. The resultant data set, in shorthand becomes {A, 2, 1, 0}, which includes one resultant unknown MSB. The procedure is repeated for each of the third nodes along the XOR tree encountered. Of the resultant data set, the subset {2, 1, 0} provides information regarding the location of a fault in the grid and an associated scan chain.

FIG. 14B illustrates the method for determining, from the XOR tree compressed scan out data, the location of a fault on a grid hosting the XOR tree. In a first column 1408, the inputs (a, b, c, d, e, f, g) are listed. In a second column 1410, the encoded output set {2,1,0}, which would be provided from the scan out data by the XOR tree compression method, is listed. By matching actual output bits from step 1406 with an encoded output option in column 1410, an associated input 1408 can be determined. The input 1408 associated with an indicated encoded output is determined to include a fault. Therefore, the fault can be traced back to a particular region of a grid over which the XOR tree compressor is overlaid. In some embodiments, the fault can be traced back to a particular scan chain of a grid over which the XOR tree compressor is overlaid. For example, if the output data set {2,1,0} returned values (0,1,0), this would indicate that the portion of the grid associated with "b" had a fault.

Figure 15:
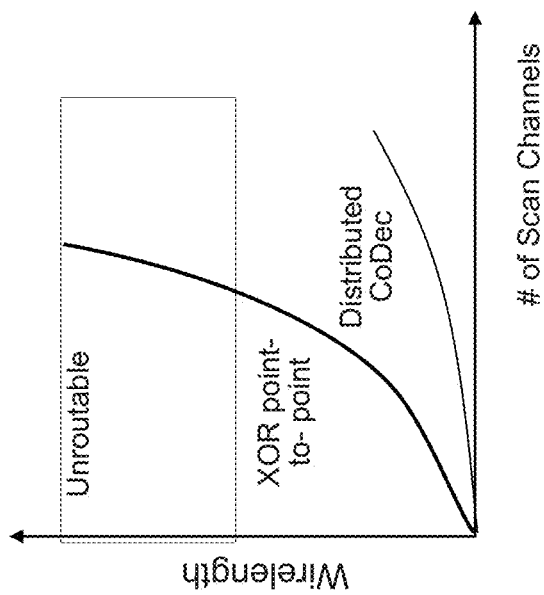
FIG. 15 illustrates the difference in wire length (along the Y-axis) to the number of scan channels (along the X-axis) when a CoDec is wired using XOR point-to-point versus a distributed CoDec as described herein.

FIG. 15 illustrates the difference in wire length (along the Y-axis) to the number of scan channels (along the X-axis) when a CoDec is wired using XOR point-to-point versus a distributed CoDec as described herein. As shown, as the number of scan channels increases, the global implementation (or point to point implementation) of wiring increases exponentially into the unroutable area while with the distributed decompression XORs the wire length increases relatively slowly.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A computer-implemented method for decompressing a set of inputs to populate a 2-dimensional grid to generate output data that facilitates diagnosis and correction of circuit faults, the method comprising:
   determining a number of scan inputs in the set of scan inputs;
   propagating each of the number of scan inputs as signals;
   determining a layout of the 2-dimensional grid over the integrated circuit;
   overlaying the determined grid with an XOR tree such that a different one of the leaves of the exclusive OR (XOR) tree is situated in each grid cell of the determined layout;
   inputting the set of scan inputs to the XOR tree so as provide scan data that facilitates diagnosis of correction of circuit faults;
   at each node of the XOR tree:
      assessing a number of signals, k, present at the node,
      if k=2: sending a first of the signals along a first path from the node and sending a second of the signals along a second path from the node to populate the 2-dimensional grid from the scan inputs,
      if k>2:
         splitting the number of signals into two sets of k−1 signals:
            the first set of signals including a first k−2 group from the number of signals,
            the second set of signals including:
               an XOR of the first k−2 group from the number of signals with an output from an XOR of a last signal from the number of signals with a second to last signal from the number of signals, and
               the last signal from the number of signals,
         sending the first set of signals along the first path from the node, and
         sending the second set of signals along the second path from the node; and
   populating all of the leaves of the XOR tree in response to each of the number of signals being split to k=2.

2. The method of claim 1, wherein if the number of scan inputs in the set of scan input is less than a number of required scan inputs to generate the 2-dimensional grid, propagating the number of scan inputs as signals along the first path from the node and propagating the number of scan inputs as signals along the second path from the node.

3. The method of claim 1, further comprising:
   providing, at each leaf of the XOR tree, a respective odd term generated from the number of scan inputs.

4. The method of claim 3, further comprising:
   connecting, at each leaf of the XOR tree, the respective odd term generated from the number of scan inputs to a scan chain in a region of the 2-dimensional grid.

5. The method of claim 3, further comprising:
   connecting, at each leaf of the XOR tree, the respective odd term generated from the number of scan inputs to a plurality of scan chains by a local broadcast of the respective odd term.

6. The method of claim 1, wherein if the number of signals at a node of the XOR tree is less than two, splitting a signal at the node such that it is provided both along the first path from the node and along the second path from the node.

7. The method of claim 1, wherein the 2-dimensional grid is determined to be of a size $2^{M-1}$, wherein M is the determined number of scan inputs.

8. An exclusive OR (XOR) tree decompressor that decompresses a set of set inputs to a design for test circuit, the XOR tree decompressor comprising:
   a communication line propagating the set of inputs as a set of signals over a 2-dimensional grid spread over an integrated circuit, the 2-dimensional grid having a number of grid cells;
   nodes at which the communication line splits into a first branch and a second branch, each node of the XOR tree decompressor resulting in a first signal set being sent along the first branch and a second signal set being sent along the second branch; and
   leaves contacting scan chains in each of the grid cells,
   wherein the first signal and the second signal are for each node determined by:
      assessing a number of signals, k, present at a respective node,
      if k=2: a first signal being the first signal set and a second signal being the second signal set,
      if k>2:
         splitting the number of signals into two sets of k−1 signals:
            the first signal set including a first k−2 group from the number of signals,
            the second signal set including:
               an XOR of the first k−2 group from the number of signals with an output from an XOR of a last signal from the number of signals with a second to last signal from the number of signals, and
               the last signal from the number of signals.

9. The exclusive OR (XOR) tree decompressor of claim 8, wherein when the leaves contact a plurality of scan chains in each of the grid cells, the leaves execute a local broadcast to the plurality of scan chains.

10. The exclusive OR (XOR) tree decompressor of claim 8, wherein the 2-dimensional grid is of a size $2^{M-1}$, wherein M is the determined number of scan inputs.

* * * * *